(12) United States Patent
Scott et al.

(10) Patent No.: US 9,787,270 B2
(45) Date of Patent: Oct. 10, 2017

(54) OVERSTRESS MANAGEMENT FOR POWER AMPLIFIERS

(71) Applicant: RF Micro Devices, Inc., Greensboro, NC (US)

(72) Inventors: Baker Scott, San Jose, CA (US); George Maxim, Saratoga, CA (US); Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 7 days.

(21) Appl. No.: 14/554,681

(22) Filed: Nov. 26, 2014

(65) Prior Publication Data

US 2015/0145594 A1    May 28, 2015

Related U.S. Application Data

(60) Provisional application No. 61/909,028, filed on Nov. 26, 2013.

(51) Int. Cl.
*H03F 1/52* (2006.01)
*H03G 3/30* (2006.01)
(Continued)

(52) U.S. Cl.
CPC ......... *H03G 3/3036* (2013.01); *H03F 1/0211* (2013.01); *H03F 1/0272* (2013.01); *H03F 1/223* (2013.01); *H03F 1/32* (2013.01); *H03F 1/523* (2013.01); *H03F 1/565* (2013.01); *H03F 3/19* (2013.01); *H03F 3/193* (2013.01); *H03F 3/45179* (2013.01); *H03F 3/45394* (2013.01); *H03F 3/68* (2013.01); *H04B 1/0475* (2013.01);
(Continued)

(58) Field of Classification Search
CPC ...... H03F 1/0211; H03F 1/0272; H03F 1/223; H03F 1/32; H03F 1/523; H03F 1/565; H03F 3/19; H03F 3/193; H03F 3/45179; H03F 3/45394; H03F 3/68; H03F 2200/324; H03F 2200/387; H03F 2200/451; H03F 2200/471; H03F 2201/3236; H03G 3/3036; H03G 3/3042; H04B 1/0475; H04B 2001/0408; H04B 2001/0416; H04B 2001/0425
USPC ....... 330/135, 156, 183, 207, 250, 253, 264, 330/269, 277, 298, 298 P See application file for complete search history.

(56) References Cited

U.S. PATENT DOCUMENTS 3,986,060 A * 10/1976 Nishizawa ............... H03D 3/00 327/581
6,525,611 B1 * 2/2003 Dening ..................... H03F 1/52 330/207 P (Continued)

*Primary Examiner* — Steven J Mottola
*Assistant Examiner* — Hafizur Rahman
(74) *Attorney, Agent, or Firm* — Withrow & Terranova, P.L.L.C.

(57) ABSTRACT

A power amplifier includes an amplifier element and overstress management circuitry coupled to the amplifier element. The overstress management circuitry is configured to detect an overstress condition of the amplifier element and adjust one or more operating parameters of the amplifier element in response to the detection of an overstress condition of the amplifier element. Using the overstress management circuitry prevents damage to the amplifier element that may occur due to uncorrected overstress conditions which may degrade or destroy a gate oxide of the amplifier element. Accordingly, the longevity of the amplifier element is improved.

20 Claims, 13 Drawing Sheets

(51) Int. Cl.
    *H03F 1/02*     (2006.01)
    *H03F 3/19*     (2006.01)
    *H04B 1/04*     (2006.01)
    *H03F 1/32*     (2006.01)
    *H03F 3/68*     (2006.01)
    *H03F 1/22*     (2006.01)
    *H03F 1/56*     (2006.01)
    *H03F 3/45*     (2006.01)
    *H03F 3/193*     (2006.01)

(52) U.S. Cl.
    CPC .. *H03F 2200/324* (2013.01); *H03F 2200/387* (2013.01); *H03F 2200/451* (2013.01); *H03F 2200/471* (2013.01); *H03F 2201/3236* (2013.01); *H03G 3/3042* (2013.01); *H04B 2001/0408* (2013.01); *H04B 2001/0416* (2013.01); *H04B 2001/0425* (2013.01)

(56) References Cited

U.S. PATENT DOCUMENTS

| | | | |
|---|---|---|---|
| 8,649,754 B2* | 2/2014 | Burgener | H01Q 23/00 455/127.3 |
| 2003/0045251 A1* | 3/2003 | Arnott | H03F 1/52 455/127.1 |
| 2004/0075504 A1* | 4/2004 | Vintola | H03F 1/52 330/298 |
| 2012/0139643 A1* | 6/2012 | Scott | H03F 1/0272 330/296 |

* cited by examiner

OVERSTRESS MANAGEMENT FOR POWER AMPLIFIERS

RELATED APPLICATIONS

This application claims the benefit of U.S. provisional patent application Ser. No. 61/909,028, filed Nov. 26, 2013, the disclosure of which is incorporated herein by reference in its entirety.

FIELD OF THE DISCLOSURE

The present disclosure relates to overstress management techniques for radio frequency (RF) power amplifiers (PAs).

BACKGROUND

As wireless communications technologies continue to evolve, the demands placed on radio frequency (RF) power amplifier (PA) circuitry used to amplify RF signals continue to dramatically increase. As a result of increasing RF signal frequencies as well as strict power, spectral masking, and bandwidth requirements, modern RF PAs are subjected to large amounts of stress over at least a portion of their operational parameters. That is, due to the ever increasing range of potential load impedances, RF signal frequencies, spectral masking requirements, environmental conditions, and supply voltages that may be encountered by RF PA circuitry, the likelihood of the device experiencing stress over at least a portion of these operational parameters is constantly growing. Many RF PAs are currently designed to avoid stress over the entirety of their operating parameters in order to increase the longevity of the RF PA. However, designing RF PA circuitry to avoid stress over all operating parameters often results in sub-optimal performance of the RF PA. Specifically, designing RF PA circuitry to avoid stress altogether requires designing the RF PA to operate without stress under the least ideal operating parameters, which may markedly decrease the performance of the RF PA when the operating parameters are not at their worst. Further, designing RF PA circuitry to avoid stress over all operating parameters is often very expensive.

Accordingly, there is a need for RF PA circuitry that is capable of avoiding stress that may damage or reduce the performance of the device and further that does not degrade the performance of the RF PA when the device is not under stress.

SUMMARY

The present disclosure relates to overstress management techniques for radio frequency (RF) power amplifiers (PAs). In one embodiment, RF PA circuitry includes an amplifier element and overstress management circuitry coupled to the amplifier element. The overstress management circuitry is configured to detect an overstress condition of the amplifier element and adjust one or more operating parameters of the amplifier element in response to the detection of an overstress condition of the amplifier element. Using the overstress management circuitry prevents damage to the amplifier element that may occur due to uncorrected overstress conditions which may degrade or destroy the amplifier element. Accordingly, the longevity of the amplifier element is improved.

In one embodiment, the overstress management circuitry includes overstress sensor circuitry and overstress control circuitry. The overstress sensor circuitry is coupled to the amplifier element and configured to detect an overstress condition of the amplifier element and produce an overstress indicator signal. The overstress control circuitry is coupled to the overstress sensor circuitry and configured to adjust one or more operating parameters of the amplifier element in response to the overstress indicator signal.

In one embodiment, the overstress sensor circuitry includes hot carrier injection (HCI) overstress sensor circuitry. The HCI overstress sensor circuitry may include input filtering circuitry, transfer function circuitry, and output filtering circuitry. In an additional embodiment, the HCI overstress sensor circuitry may include integrator circuitry. The HCI overstress sensor circuitry may receive a bulk current of the amplifier element and process the bulk current to generate an overstress indicator signal, which is subsequently used by overstress control circuitry to alter one or more operating parameters of the amplifier element.

In one embodiment, the overstress sensor circuitry includes gate oxide integrity (GOI) overstress sensor circuitry. The GOI overstress sensor circuitry may include transfer function circuitry and output filtering circuitry. The GOI overstress sensor circuitry may measure a voltage between one or more contacts (terminals) of the amplifier element and process the voltage to generate an overstress indicator signal, which is subsequently used by overstress control circuitry to alter one or more operating parameters of the amplifier element.

In one embodiment, the overstress management circuitry changes a bias signal provided to the amplifier element in order to reduce a detected overstress condition. In an additional embodiment, the overstress management circuitry changes one or more properties of an RF input signal provided to the amplifier element in order to reduce a detected overstress condition. In yet another embodiment, the overstress management circuitry changes one or more properties of an RF output signal produced at an output of the amplifier element and/or an impedance presented at the output of the amplifier element in order to reduce a detected overstress condition. Further, the overstress management circuitry may simultaneously change one or more of the bias signal provided to the amplifier element, the RF input signal provided to the amplifier element, or the RF output signal at an output of the amplifier element.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
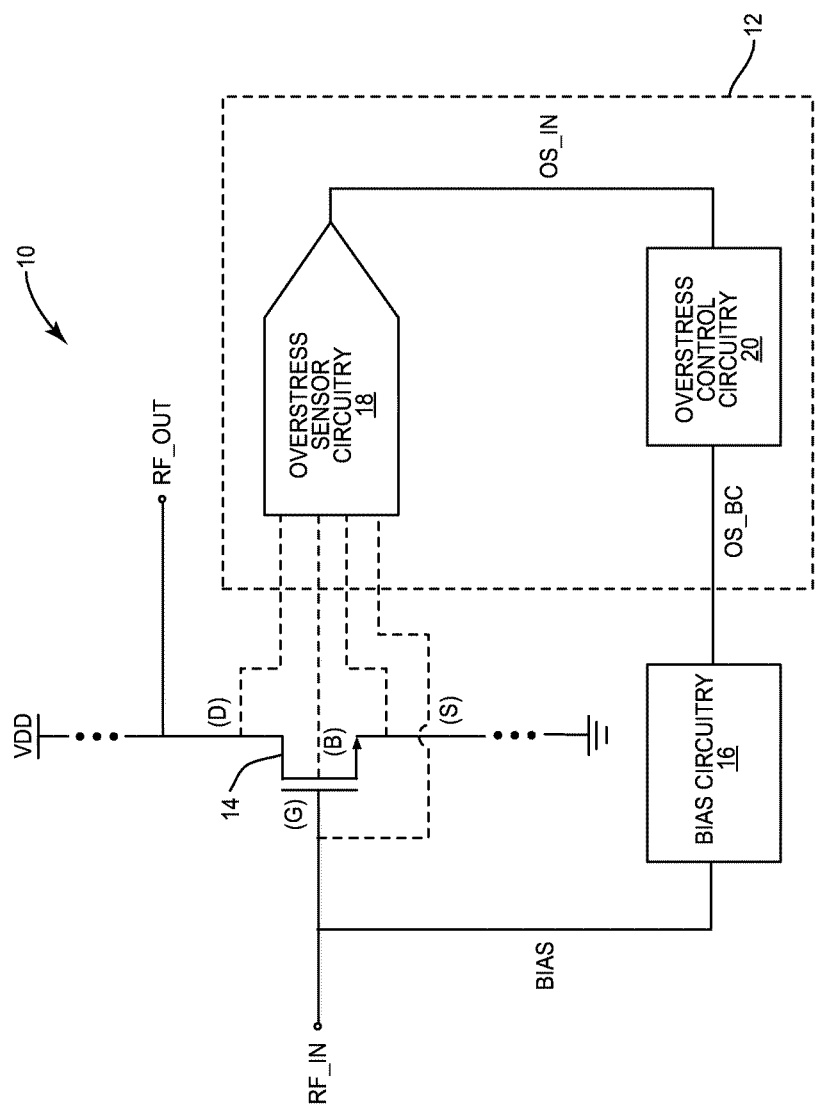
FIG. 1 is a schematic showing radio frequency (RF) power amplifier (PA) circuitry including overstress management circuitry according to one embodiment of the present disclosure.

FIG. 1 shows radio frequency (RF) power amplifier (PA) circuitry 10 including overstress management circuitry 12 according to one embodiment of the present disclosure. The RF PA circuitry 10 includes an amplifier element 14, bias circuitry 16 coupled to the amplifier element 14, and the overstress management circuitry 12 coupled to the amplifier element 14 and the bias circuitry 16. The overstress management circuitry 12 includes overstress sensor circuitry 18 and overstress control circuitry 20. The overstress sensor circuitry 18 is coupled to the amplifier element 14 at one or more points. Specifically, in the case that the amplifier element is a metal-oxide-semiconductor field-effect transistor (MOSFET) as shown in FIG. 1, the overstress sensor circuitry 18 may be coupled to one or more of a gate contact (G), a drain contact (D), a source contact (S), or a substrate (i.e., bulk or body) contact (B). While a MOSFET is shown in FIG. 1 for illustration purposes, the amplifier element 14 may be any suitable semiconductor device. For example, the amplifier element 14 may be a bipolar junction transistor (BJT), a high electron mobility transistor (HEMT), a metal-semiconductor field-effect transistor (MESFET), or the like. Further, the amplifier element 14 may comprise several transistor devices coupled in cascode or any other suitable fashion. In general, the overstress sensor circuitry 18 may be coupled to any number of inputs and/or outputs of the amplifier element 14, which may vary based on the type of the amplifier element 14 or amplifier elements 14 in the RF PA circuitry 10. An output of the overstress sensor circuitry 18 is coupled to the overstress control circuitry 20.

In operation, an RF input signal RF_IN is received at an input of the amplifier element 14. In the case that the amplifier element 14 is a MOSFET as shown in FIG. 1, the RF input signal RF_IN is received at the gate contact (G) of the device. However, as discussed above, the input of the amplifier element 14 may differ based on the type of device used for the amplifier element 14. For example, if the amplifier element 14 is a BJT, the RF input signal RF_IN will be received at a base contact of the device. The amplifier element 14 also receives a bias signal BIAS from the bias circuitry 16 and a power supply voltage VDD from a voltage supply (not shown). In the case that the amplifier element 14 is a MOSFET, the bias signal BIAS is received at the gate contact (G) of the amplifier element 14, while the power supply voltage VDD is received at the drain contact (D) of the device. The amplifier element 14 amplifies the RF input signal RF_IN using the bias signal BIAS and the power supply voltage VDD to generate an RF output signal RF_OUT at an output of the amplifier element 14. In the case that the amplifier element 14 is a MOSFET as shown in FIG. 1, the RF output signal RF_OUT is generated at the drain contact (D) of the device. However, as discussed above, the output of the amplifier element 14 may differ based on the type of device used for the amplifier element 14.

Throughout the amplification process described above, the overstress sensor circuitry 18 monitors for an overstress condition of the amplifier element 14. An overstress condition may take several different forms and may be monitored in different ways, as discussed in detail below. Upon detection of an overstress condition, the overstress sensor circuitry 18 produces an overstress indicator signal OS_IN, which is delivered to the overstress control circuitry 20. The overstress control circuitry 20 then adjusts one or more operating parameters of the amplifier element 14 in response to the overstress indicator signal OS_IN. While the overstress control circuitry 20 may adjust many different operating parameters of the amplifier element 14, the overstress control circuitry 20 shown in FIG. 1 is coupled to the bias circuitry 16. Accordingly, the overstress control circuitry 20 shown in FIG. 1 is configured to adjust the bias signal BIAS delivered to the amplifier element 14 via an overstress bias control signal OS_BC. By adjusting the bias signal BIAS delivered to the amplifier element 14 upon the occurrence of an overstress condition, the stress on the amplifier element 14 may be reduced or eliminated altogether, thereby avoiding damage to the amplifier element 14 and thus improving the longevity thereof. When the amplifier element 14 is not experiencing stress, the overstress indicator signal OS_IN may not be produced or may indicate the lack of an overstress condition. Accordingly, the overstress control circuitry 20 may not adjust the bias signal BIAS delivered to the amplifier element 14 and thus will not interfere with the operation of the amplifier element 14 when the amplifier element 14 is not experiencing an overstress condition.

As discussed above, there are several different types of overstress conditions that may be experienced by the amplifier element 14 and thus many different ways for the overstress sensor circuitry 18 to detect such an overstress condition. As a first example, the overstress sensor circuitry 18 may monitor the amplifier element 14 for a gate oxide integrity (GOI) overstress condition. In such an embodiment, the overstress sensor circuitry 18 may monitor a voltage across two contacts of the amplifier element 14. In the embodiment shown in FIG. 1 in which the amplifier element 14 is a MOSFET, the overstress sensor circuitry 18 may monitor a voltage between the gate contact (G) and the drain contact (D) of the device. The voltage between the gate contact (G) and the drain contact (D) may indicate the integrity of a gate oxide in the amplifier element 14. Specifically, when the voltage between the gate contact (G) and the drain contact (D) of the amplifier element 14 is above a predetermined threshold, it may indicate that the gate oxide is in danger of breaking down, thus permanently damaging the device. Accordingly, the overstress sensor circuitry 18 may provide the overstress indicator signal OS_IN when the voltage between the gate contact (G) and the drain contact (D) of the amplifier element 14 is above a predetermined threshold. In various embodiments, the overstress sensor circuitry 18 may process the measured voltage such that the overstress indicator signal OS_IN is proportional to the amount of overstress experienced by the amplifier element 14 and thus the level of correction that is necessary from the overstress control circuitry 20.

As a second example, the overstress sensor circuitry 18 may monitor the amplifier element 14 for a hot carrier injection (HCI) overstress condition. In such an embodiment, the overstress sensor circuitry 18 may monitor a current through a substrate of the amplifier element 14, for example, via the substrate (i.e., bulk or body) contact (B). Specifically, when current through the substrate of the amplifier element 14 is above a predetermined threshold, it may indicate that HCI in the amplifier element 14 is occurring on a scale that may damage the device. Accordingly, the overstress sensor circuitry 18 will provide the overstress indicator signal OS_IN when the current through the substrate of the amplifier element 14 is above a predetermined threshold. In various embodiments, the overstress sensor circuitry 18 may process the measured current such that the overstress indicator signal OS_IN is proportional to the amount of overstress experienced by the amplifier element 14 and thus the level of correction that is necessary for the overstress control circuitry 20.

Although only a single amplifier element 14 is shown in the RF PA circuitry 10 shown in FIG. 1, any number of amplifier elements may be present in the RF PA circuitry 10 and connected to one another in any fashion without departing from the principles described herein. For example, the RF PA circuitry 10 may include any number of amplifier elements arranged in a cascode configuration or may include a number of pairs of amplifier elements arranged in a differential configuration. The overstress management circuitry 12 is connected to at least one amplifier element 14 in the RF PA circuitry 10, but may be connected to any number of amplifier elements without departing from the principles of the present disclosure. Further, as discussed above, the amplifier elements 14 may be any type of semiconductor device, and individually may be different types of semiconductor devices. For example, the RF PA circuitry 10 may include any number of FETs, MOSFETs, BJTs, HEMTs, or the like.

Figure 2:
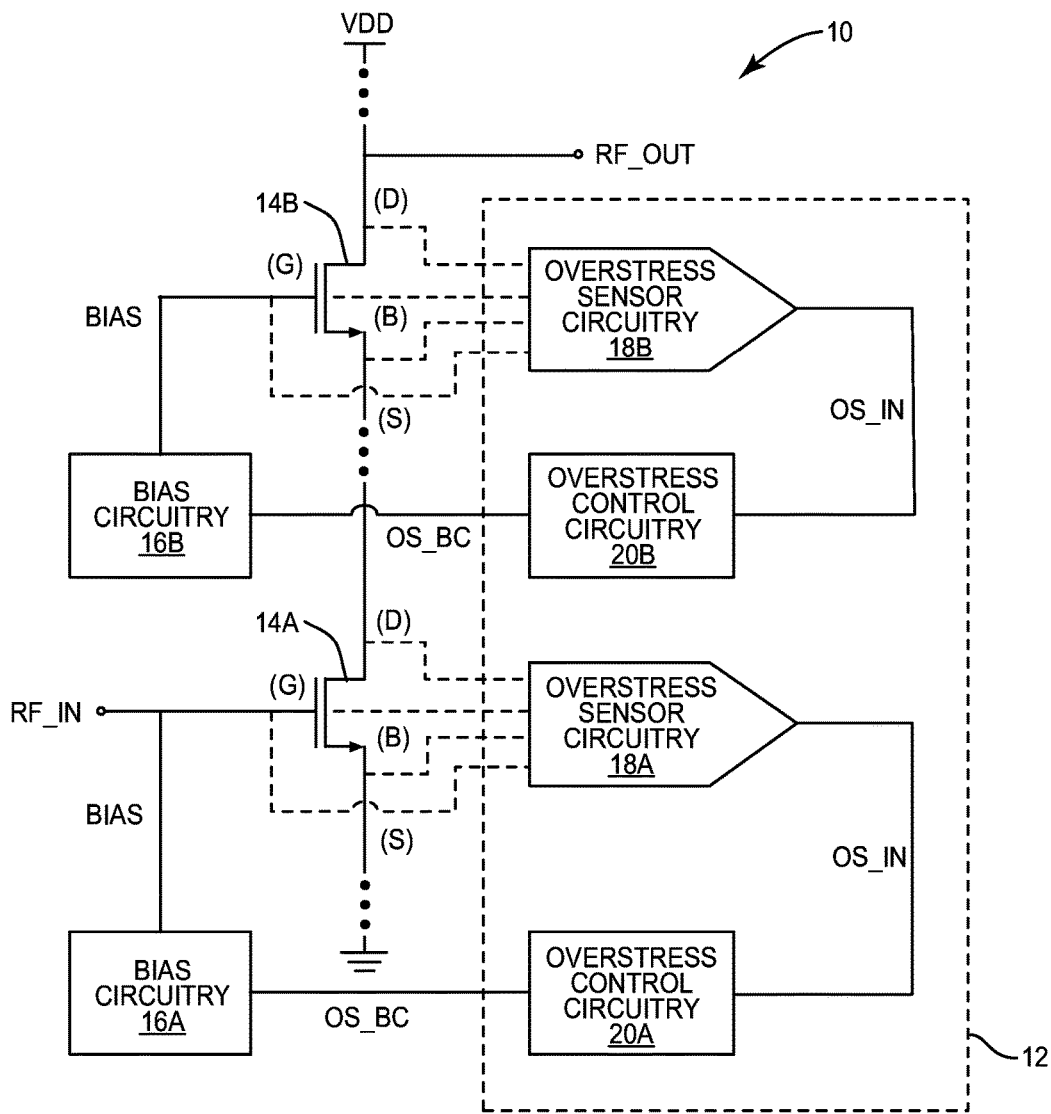
FIG. 2 is a schematic showing RF PA circuitry including overstress management circuitry according to an additional embodiment of the present disclosure.

FIG. 2 shows the RF PA circuitry 10 of FIG. 1 wherein the RF PA circuitry 10 includes at least two amplifier elements 14 coupled in a cascode configuration. As shown in FIG. 2, a first one of the amplifier elements 14A is coupled to first overstress sensor circuitry 18A, which is in turn coupled to first overstress control circuitry 20A and first bias circuitry 16A. Further, a second one of the amplifier elements 14B is coupled to second overstress sensor circuitry 18B, which is in turn coupled to second overstress control circuitry 20B and second bias circuitry 16B. The first overstress sensor circuitry 18A and the first overstress control circuitry 20A may function completely independently of the second overstress sensor circuitry 18B and the second overstress control circuitry 20B. This is advantageous in many circumstances in which the operation conditions of the first amplifier element 14A are different from those of the second amplifier element 14B. For example, the first amplifier element 14A may amplify more RF signal than the second amplifier element 14B based on the respective bias signals BIAS provided to the amplifier elements 14. Accordingly, the separate amplifier elements 14 may experience overstress conditions at different times and thus require independent correction.

In operation, the RF input signal RF_IN is received at an input of the first amplifier element 14A. The first amplifier element 14A amplifies the RF input signal RF_IN and provides the amplified signal to an output of the first amplifier element 14. In the case wherein the first amplifier is a MOSFET as shown in FIG. 1, the RF input signal RF_IN is provided to a gate contact (G) of the first amplifier element 14A and the amplified signal is provided to a drain contact (D) of the first amplifier element 14A. The amplified signal is received at a source contact (S) of the second amplifier element 14B and further amplified to produce the RF output signal RF_OUT, which is provided at a drain contact (D) of the second amplifier element 14B.

Throughout the operation of the first amplifier element 14A and the second amplifier element 14B, the first overstress sensor circuitry 18A and the second overstress sensor circuitry 18B respectively monitor for overstress conditions on the amplifier elements 14 to which they are attached. On the occurrence of an overstress condition, the overstress control circuitry 18 provides the overstress indicator signal OS_IN, which is used by the connected overstress control circuitry 20 to alter one or more operational parameters of the amplifier element 14 to which the overstress sensor circuitry 18 is connected. In the embodiment shown in FIG. 2, the overstress control circuitry 20 provides an overstress bias control signal OS_BC, which is used by the bias circuitry 16 to alter a bias signal BIAS provided to the connected amplifier element 14. Altering the bias signal BIAS provided to each one of the amplifier elements 14 based on the detection of an overstress condition effectively prevents the respective amplifier elements 14 from operating in the overstress condition for a prolonged period of time, thereby preventing damage to the devices and increasing their longevity.

Figure 3:
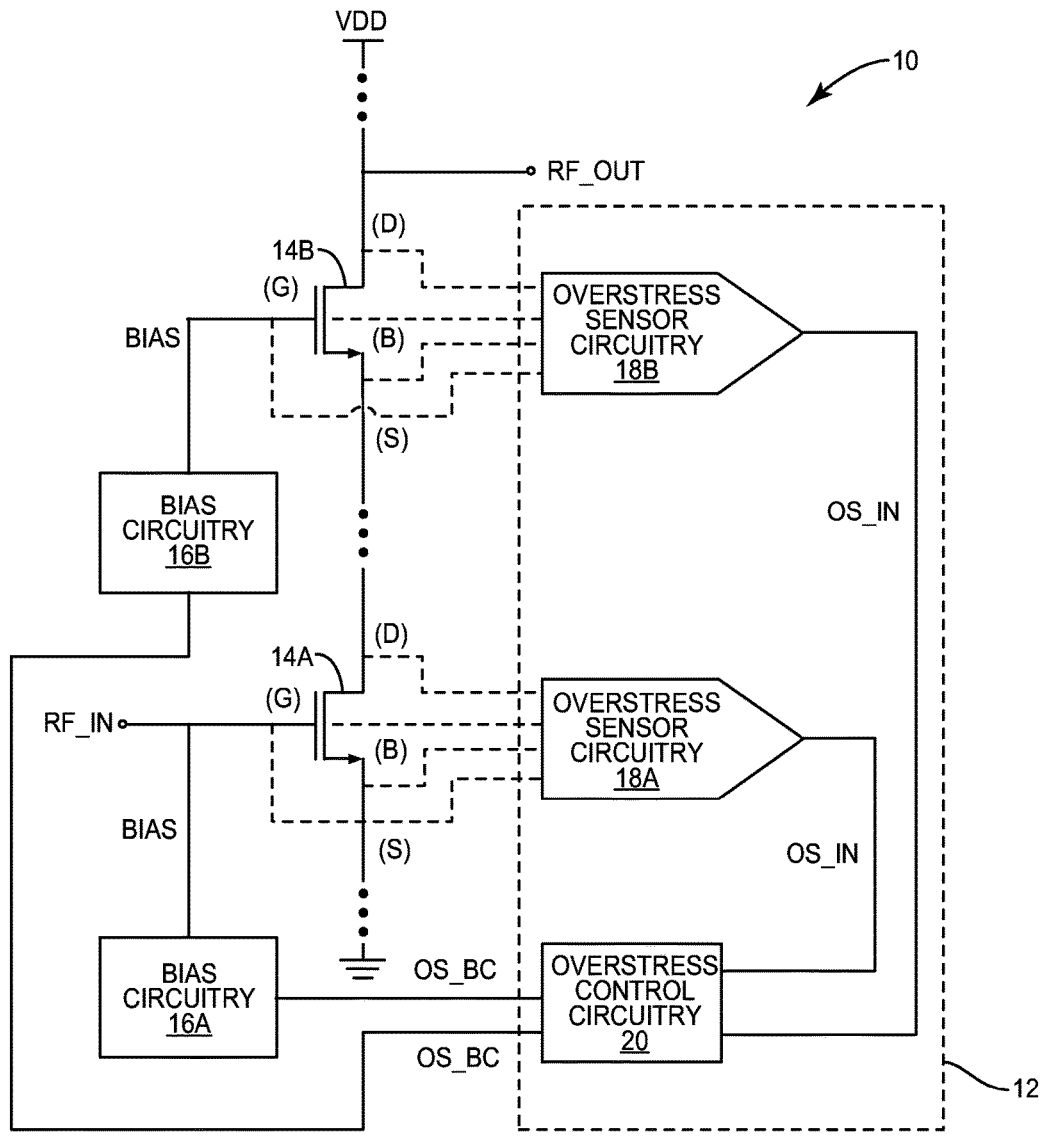
FIG. 3 is a schematic showing RF PA circuitry including overstress management circuitry according to an additional embodiment of the present disclosure.

FIG. 3 shows the RF PA circuitry 10 according to yet another embodiment of the present disclosure. The RF PA circuitry 10 shown in FIG. 3 is substantially similar to that shown in FIG. 2, except that the first overstress control circuitry 20A and the second overstress control circuitry 20B are combined into unified overstress control circuitry 20. The RF PA circuitry 10 shown in FIG. 3 functions in a substantially similar manner to that described above with respect to FIG. 2, except that the overstress control circuitry 20 shown in FIG. 3 accepts the overstress indicator signal OS_IN provided individually from each one of the first overstress sensor circuitry 18A and the second overstress sensor circuitry 18B and provides an overstress bias control signal OS_BC individually to each one of the first bias circuitry 16A and the second bias circuitry 16B.

The overstress control circuitry 20 shown in FIG. 3 may operate independently for each one of the first amplifier element 14A and the second amplifier element 14B, or may consider each one of the overstress indicator signal OS_IN provided from the overstress sensor circuitry 18 together to provide the overstress bias control signal OS_BC for each of the first bias circuitry 16A and the second bias circuitry 16B. Further, the overstress control circuitry 20 may use the same or different signals for the overstress bias control signals OS_BC provided to each one of the first bias circuitry 16A and the second bias circuitry 16B. Typically, the overstress bias control signal OS_BC provided to each one of the first bias circuitry 16A and the second bias circuitry 16B will be different due to the different operational parameters of each one of the first amplifier element 14A and the second amplifier element 14B.

Figure 4:
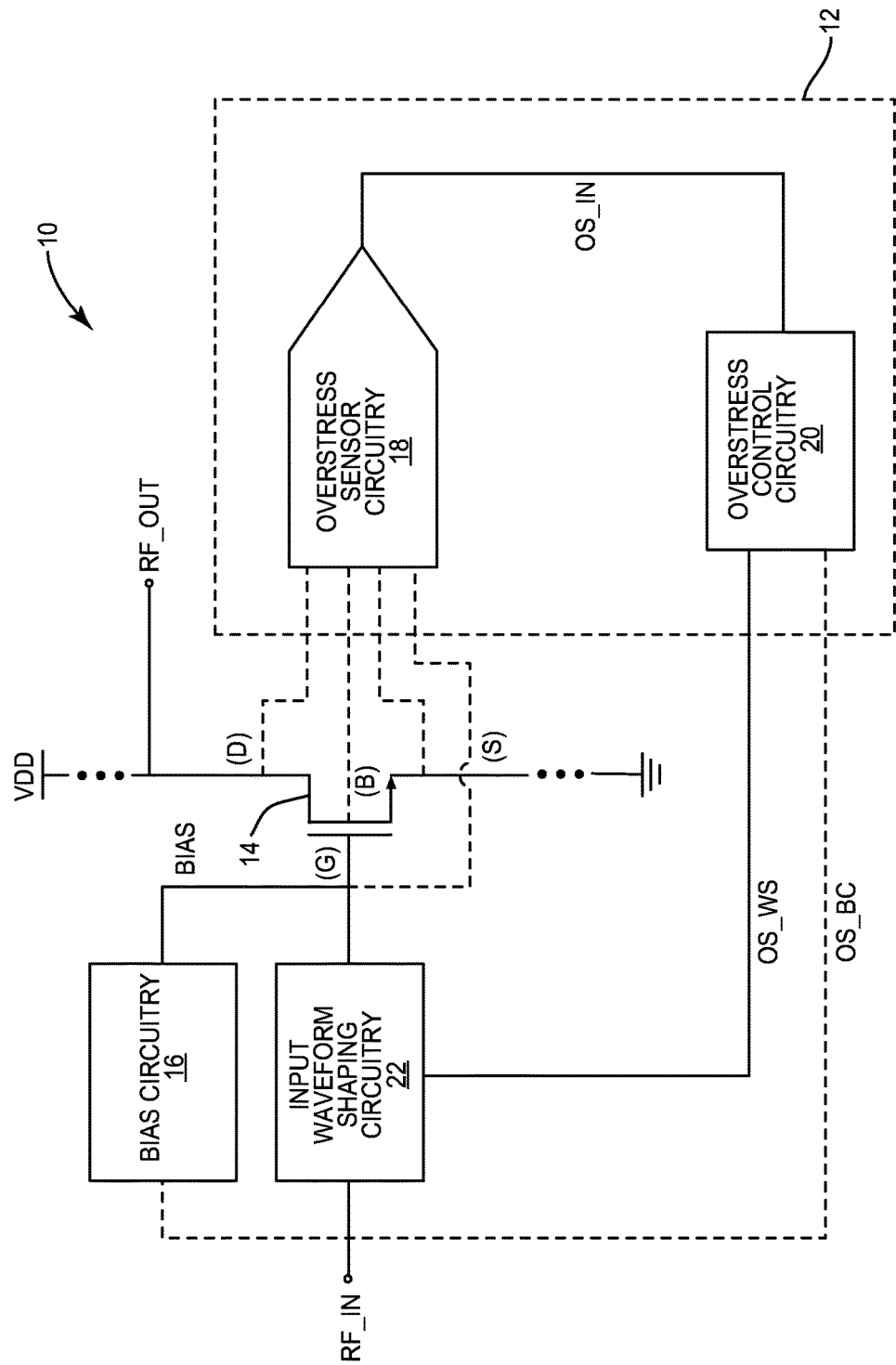
FIG. 4 is a schematic showing RF PA circuitry including overstress management circuitry according to an additional embodiment of the present disclosure.

FIG. 4 shows the RF PA circuitry 10 according to an additional embodiment of the present disclosure. The RF PA circuitry 10 shown in FIG. 4 is substantially similar to that shown in FIG. 1, except the RF PA circuitry 10 shown in FIG. 4 further includes input waveform shaping circuitry 22 to which the overstress control circuitry 20 is coupled. The input waveform shaping circuitry 22 is coupled to an input of the amplifier element 14. In the case wherein the amplifier element 14 is a MOSFET as shown in FIG. 4, the input waveform shaping circuitry 22 is connected to a gate contact (G) of the amplifier element 14, such that the input waveform shaping circuitry 22 is coupled between the overstress control circuitry 20 and the gate contact (G) of the amplifier element 14.

The RF PA circuitry 10 shown in FIG. 4 may function in a substantially similar manner as described above with respect to FIG. 1 wherein the RF input signal RF_IN is received at an input of the amplifier element 14, amplified, and provided to an output of the amplifier element 14. As discussed above, in the case wherein the amplifier element 14 is a MOSFET as shown in FIG. 4, the input of the amplifier element 14 may be a gate contact (G), while the output may be a drain contact (D). The overstress sensor circuitry 18 monitors the amplifier element 14 for one or more overstress conditions, and provides the overstress indicator signal OS_IN to the overstress control circuitry 20. Rather than providing the overstress bias control signal OS_BC as in FIG. 1 or in addition to providing the bias control signal OS_BC, the overstress control circuitry 20 provides an overstress waveform shaping OS_WS signal to the input waveform shaping circuitry 22. In response to the overstress waveform shaping signal OS_WS, the input waveform shaping circuitry 22 changes one or more signal properties of the RF input signal RF_IN delivered to the amplifier element 14. For example, the input waveform shaping circuitry 22 may change an amplitude, phase, or both of the RF input signal RF_IN. In general, the input waveform shaping circuitry 22 changes one or more signal properties of the RF input signal RF_IN such that the overstress condition detected by the overstress sensor circuitry 18 is reduced.

The input waveform shaping circuitry 22 may be any suitable circuitry for changing one or more signal properties of the RF input signal RF_IN, the principles of which are well known in the art. For example, the input waveform shaping circuitry 22 may include one or more variable impedance elements that are adjustable. The overstress waveform shaping signal OS_WS may change one or more of these adjustable impedances such that an amplitude, a phase, or both of the RF input signal RF_IN is altered, thereby reducing an overstress condition detected by the overstress sensor circuitry 18.

In one embodiment, the overstress control circuitry 20 is additionally connected to the bias circuitry 16 such that the overstress control circuitry 20 provides the overstress bias control signal OS_BC in addition to the overstress waveform shaping OS_WS signal. Accordingly overstress conditions may be reduced by simultaneously adjusting the bias signal BIAS and the RF input signal RF_IN provided to the amplifier element 14.

Figure 5:
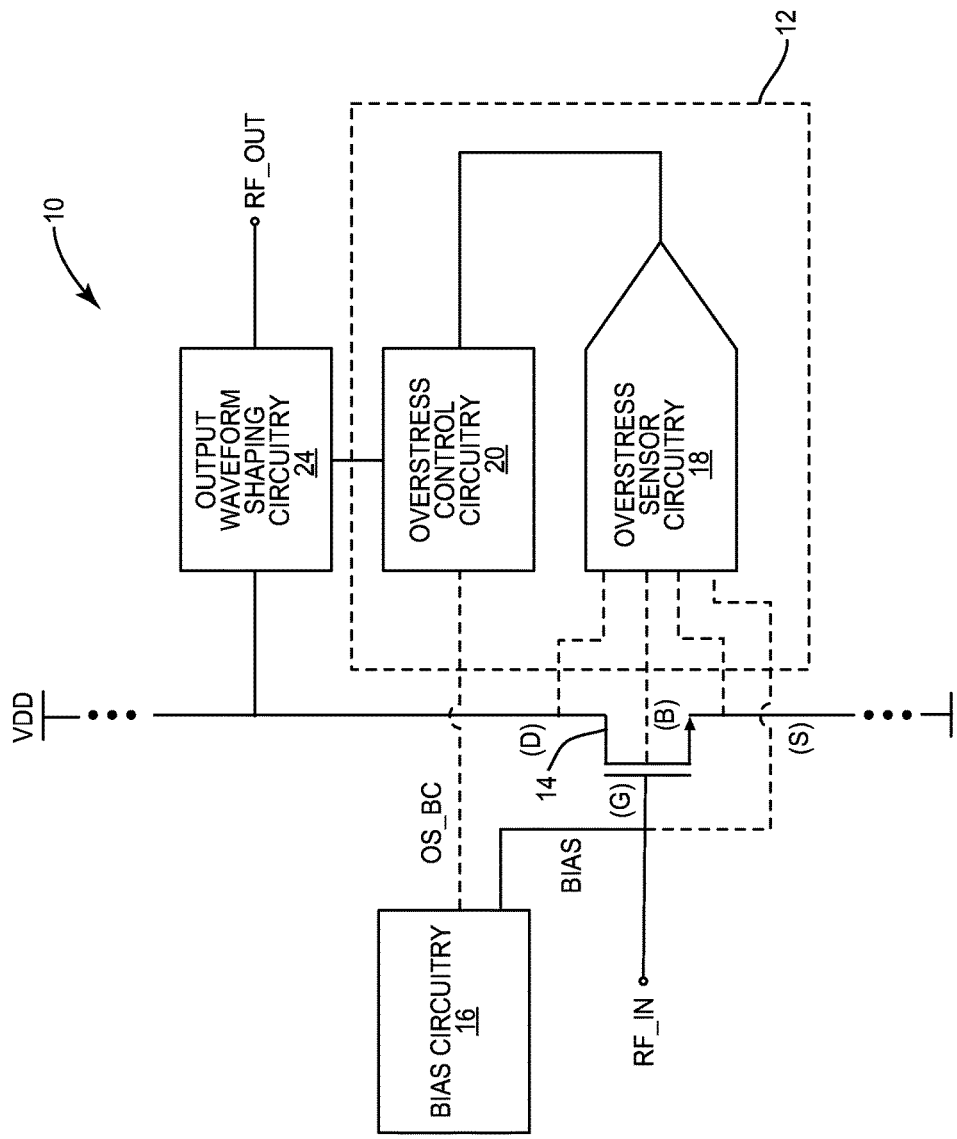
FIG. 5 is a schematic showing RF PA circuitry including overstress management circuitry according to an additional embodiment of the present disclosure.

FIG. 5 shows the RF PA circuitry 10 according to another embodiment of the present disclosure. The RF PA circuitry shown in FIG. 5 is substantially similar to that shown in FIG. 4, except that the input waveform shaping circuitry 22 shown in FIG. 5 is replaced by output waveform shaping circuitry 24. The RF PA circuitry shown in FIG. 5 may function in a substantially similar manner as described above with respect to FIG. 4, except that instead of changing one or more signal properties of the RF input signal RF_IN via the input waveform shaping circuitry 22, the output waveform shaping circuitry 24 changes one or more signal properties of the RF output signal RF_OUT and the impedance presented at an output of the amplifier element 14. In the case wherein the amplifier element 14 is a MOSFET, the output waveform shaping circuitry 24 may change an impedance presented at a drain contact (D) of the amplifier element 14 and thus one or more signal properties of the RF output signal RF_OUT. As discussed above, the output waveform shaping circuitry may change the amplitude, phase, or both of the RF output signal RF_OUT based on the overstress waveform shaping signal OS_WS provided by the overstress control circuitry 20.

Similar to the input waveform shaping circuitry 22, the output waveform shaping circuitry may be any suitable circuitry for changing one or more signal properties of the RF output signal RF_OUT, the principles of which are well known in the art. For example, the output waveform shaping circuitry 24 may include one or more variable impedance elements that are adjustable. The overstress waveform shaping signal OS_WS may change one or more of these adjustable impedances such that an amplitude, a phase, or both of the RF output signal RF_OUT is altered, thereby reducing an overstress condition detected by the overstress sensor circuitry.

In one embodiment, the overstress control circuitry 20 is additionally connected to the bias circuitry 16 such that the overstress control circuitry 20 provides the overstress bias control signal OS_BC in addition to the overstress waveform shaping signal OS_WS. Accordingly, overstress conditions may be reduced by simultaneously adjusting the bias signal BIAS and the RF output signal RF_OUT. Although not explicitly shown, the input waveform shaping circuitry 22 and the output waveform shaping circuitry 24 may also be used together, and may even be used together with the bias circuitry 16 such that the overstress control circuitry 20 is capable of adjusting one or more of the bias signal BIAS provided to the amplifier element 14, the RF input signal RF_IN provided to the amplifier element 14, and the RF output signal RF_OUT and impedance presented at an output of the amplifier element 14.

Figure 6:
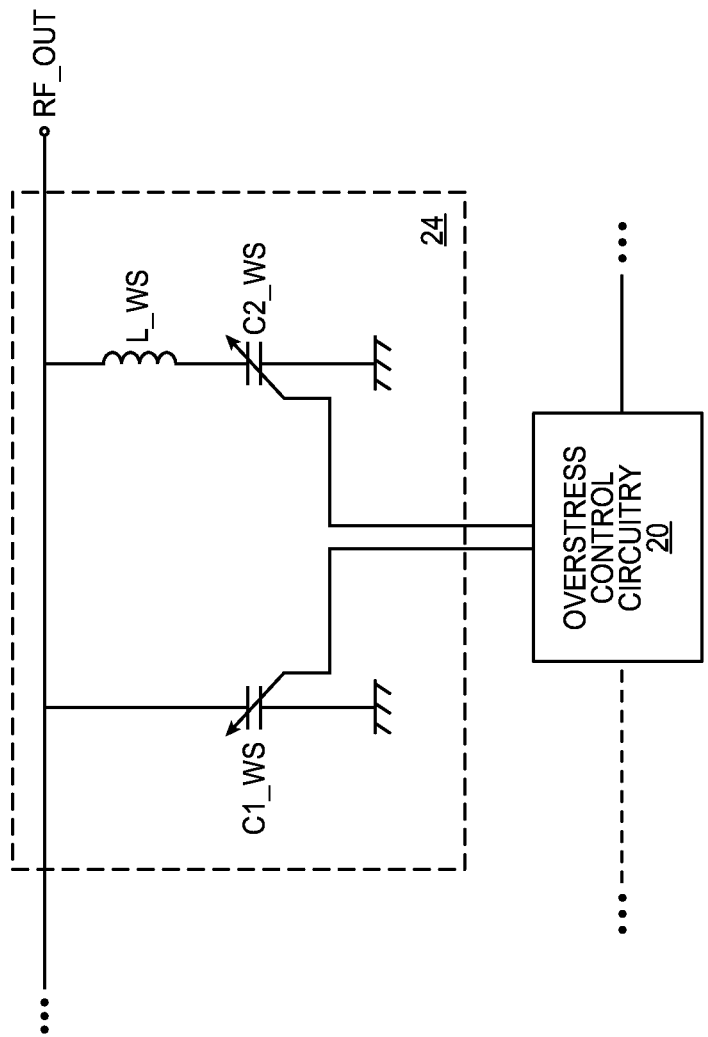
FIG. 6 is a schematic showing details of the output waveform shaping circuitry shown in FIG. 5 according to one embodiment of the present disclosure.

FIG. 6 shows details of the output waveform shaping circuitry 24 according to one embodiment of the present disclosure. As shown in FIG. 6, the output waveform shaping circuitry 24 includes a first waveform shaping capacitor C1_WS coupled between the drain contact (D) of the amplifier element 14 and ground. Further, the output waveform shaping circuitry 24 includes a second waveform shaping capacitor C2_WS and a waveform shaping inductor L_WS coupled in series between the drain contact (D) of the amplifier element 14 and ground. The overstress control circuitry 20 is coupled to each one of the first waveform shaping capacitor C1_WS and the second waveform shaping capacitor C2_WS and is configured to adjust the capacitance of each such that a harmonic trap is created by the output waveform shaping circuitry 24 around the peak output voltage of the amplifier element 14. Accordingly, the peak output voltage of the amplifier element 14 can be reduced, thereby avoiding overstress of the device.

Figure 7:
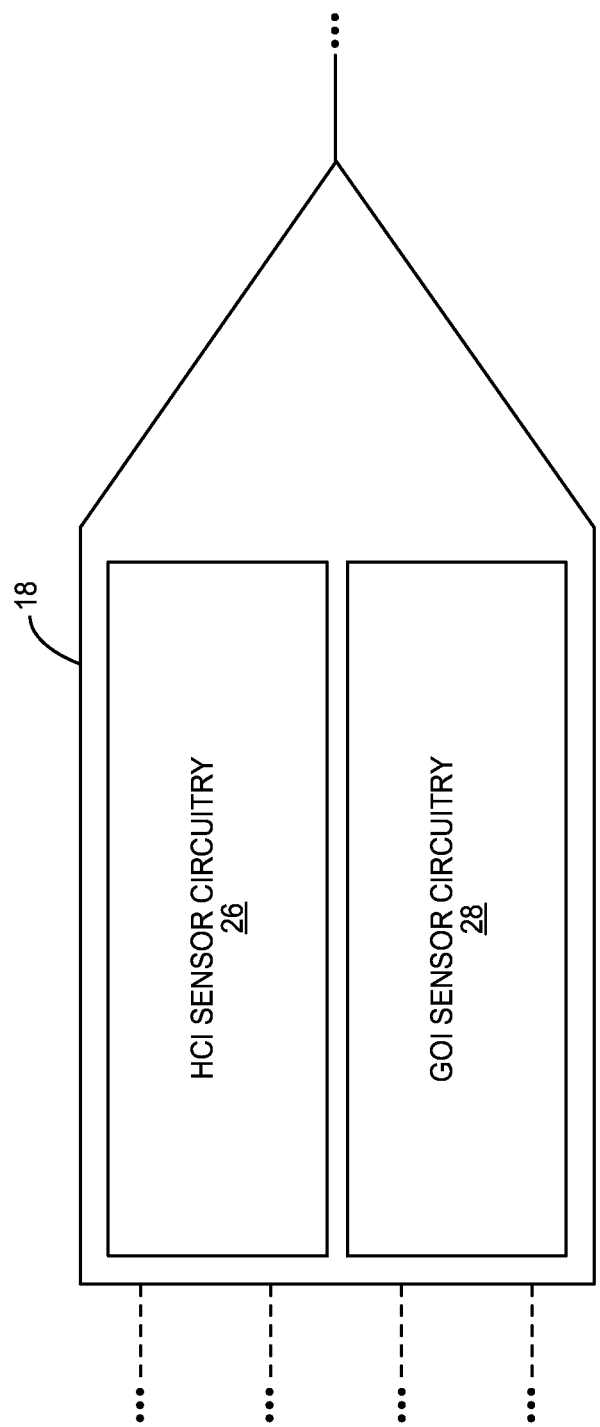
FIG. 7 is a block diagram showing overstress sensor circuitry according to one embodiment of the present disclosure.

FIG. 7 shows details of the overstress sensor circuitry 18 according to one embodiment of the present disclosure. As shown in FIG. 7, the overstress sensor circuitry 18 may include HCI sensor circuitry 26 and 001 sensor circuitry 28. As discussed above, a number of different overstress conditions may be experienced by the amplifier element 14 or amplifier elements 14 in the RF PA circuitry 10. Accordingly, the overstress sensor circuitry 18 may require separate sensor circuitry to detect each one of these different conditions. In the embodiment shown in FIG. 7, the HCI sensor circuitry 26 may detect overstress conditions due to excess hot carrier injection, as discussed above. Accordingly, the HCI sensor circuitry 26 may measure a substrate (i.e., bulk or body) current of an amplifier element 14. As discussed in detail below, in order to isolate the bulk current from leakage currents due to capacitive coupling of one or more inputs or outputs of the amplifier element 14, filtering circuitry and/or converter circuitry of some type may be required in order to provide the overstress indicator signal OS_IN, as discussed in detail below. The GOI sensor circuitry 28 measures the gate oxide integrity of an amplifier element 14 by detecting a voltage difference between two or more points in the device. In the embodiment in which the amplifier element 14 is a MOSFET, the GOI sensor circuitry 28 may measure the voltage present between a gate contact (G) and a drain contact (D) of the device. The gate-to-drain voltage of the device may be indicative of the health of the gate oxide of the device. Accordingly, when the gate-to-drain voltage is above a predetermined threshold it may indicate that the device is in danger of breakdown and/or damage. As with the HCI sensor circuitry 26, the GOI sensor circuitry 28 may also require filtering circuitry and/or converter circuitry of some type in order to translate one or more measurements from the amplifier element 14 into the overstress indicator signal OS_IN, as discussed in detail below.

Figure 8:
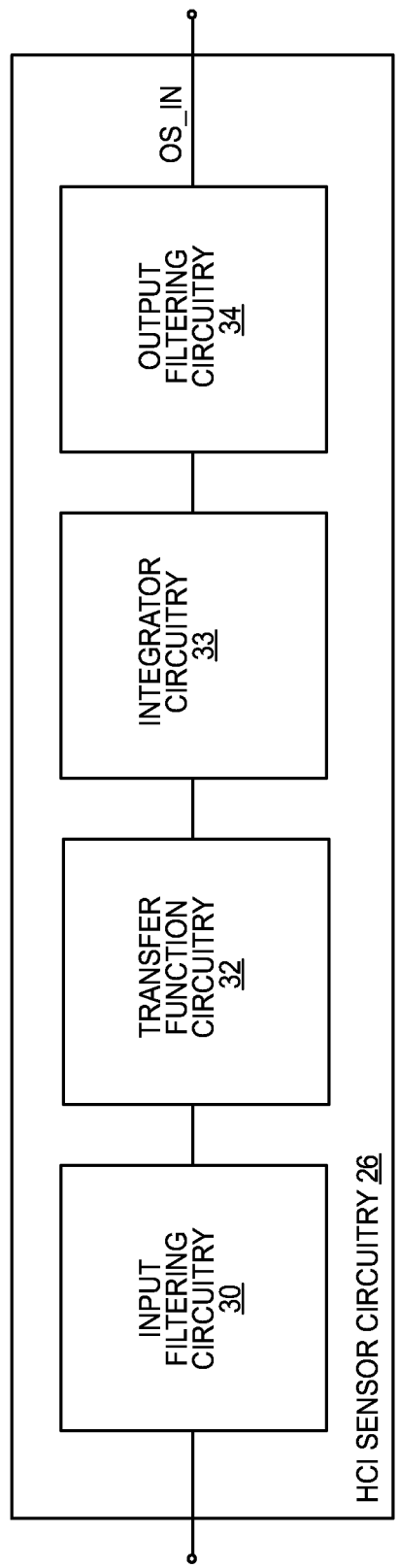
FIG. 8 is a block diagram showing details of the overstress sensor circuitry shown in FIG. 7 according to one embodiment of the present disclosure.

FIG. 8 shows details of the HCI sensor circuitry 26 according to one embodiment of the present disclosure. As shown in FIG. 8, the HCI sensor circuitry 26 includes input filtering circuitry 30, transfer function circuitry 32, optional integrator circuitry 33, and output filtering circuitry 34. As discussed above, the bulk current of the amplifier element 14 may include a component attributable to HCI, as well as a component attributable to leakage current due to capacitive coupling of one or more inputs and outputs of the device. For example, in the case wherein the amplifier element 14 is a MOSFET, leakage of the RF input signal RF_IN from the gate contact (G) and the drain contact (D) may occur due to capacitive coupling of the gate contact (G) and the drain contact (D) to the bulk of the device. Accordingly, the input filtering circuitry 30 may be low pass filtering circuitry in order to filter out the RF components of the bulk current that are attributable to leakage of the RF input signal RF_IN. The transfer function circuitry 32 may appropriately transform the filtered bulk current in order to generate a preliminary overstress indicator signal OS_IN, which is then integrated by the integrator circuitry 33 and filtered by the output filtering circuitry 32. In one embodiment, the transfer function circuitry 32 performs a non-linear transform on the filtered bulk current; however, any transfer function may be implemented by the transfer function circuitry 32 without departing from the principles of the present disclosure.

Figure 9:
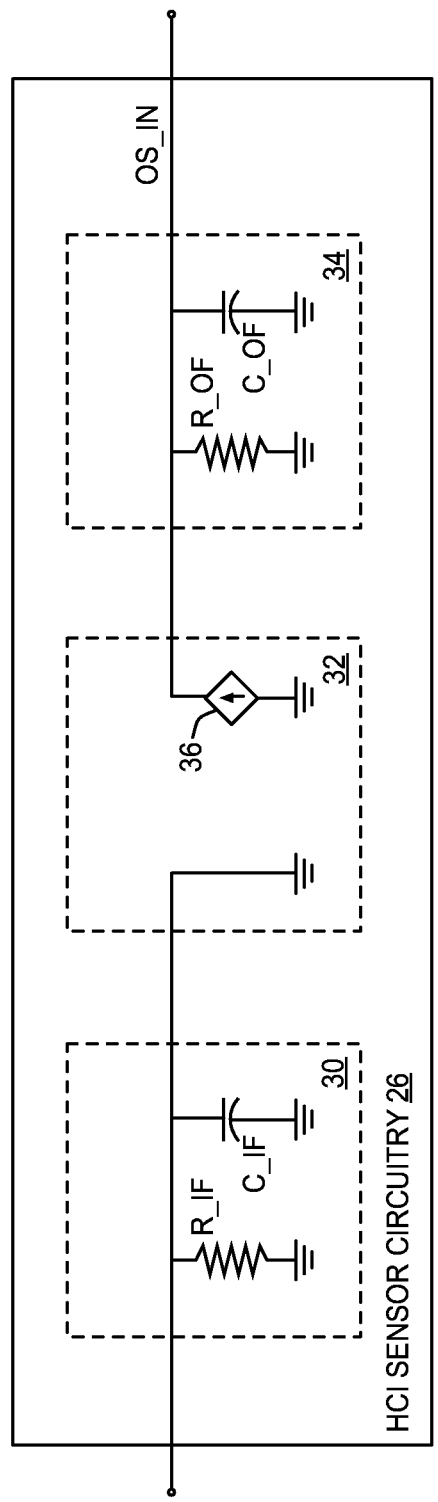
FIG. 9 is a schematic showing details of the overstress sensor circuitry shown in FIG. 8 according to one embodiment of the present disclosure.

FIG. 9 shows further details of the HCI sensor circuitry 26 according to one embodiment of the present disclosure wherein the integrator circuitry 33 is not included. As shown in FIG. 9, the input filtering circuitry 30 includes an input filter resistor R_IF and an input filter capacitor C_IF coupled between an input of the HCI sensor circuitry 26 and ground. Accordingly, the input filtering circuitry 30 is an RC filter circuit, the characteristics of which may be designed according to principles that are well known in the art. Although an RC filter circuit is shown for purposes of illustration in FIG. 9, any suitable filtering circuitry may be used without departing from the principles of the present disclosure. The transfer function circuitry 32 may include a dependent current source 36, which may be implemented in any number of ways well known in the art. As discussed above, the dependent current source 36 may provide a current that is linearly related to the bulk current I_B of the amplifier element 14 or non-linearly related to the bulk current I_B of the amplifier element 14. While the dependent current source 36 is shown for purposes of illustration, the transfer function circuitry 32 may be implemented in any number of ways that are well known in the art. Similar to the input filtering circuitry 30, the output filtering circuitry 34 includes an output filter resistor R_OF and an output filter capacitor C_OF. Accordingly, the output filtering circuitry 34 is also an RC filter circuit, the characteristics of which may be designed according to principles that are well known in the art. The resulting overstress indicator signal OS_IN is used by the overstress control circuitry 20 to alter one or more operating parameters of the amplifier element 14 and thus avoid damage to the device due to overstress.

Figure 10:
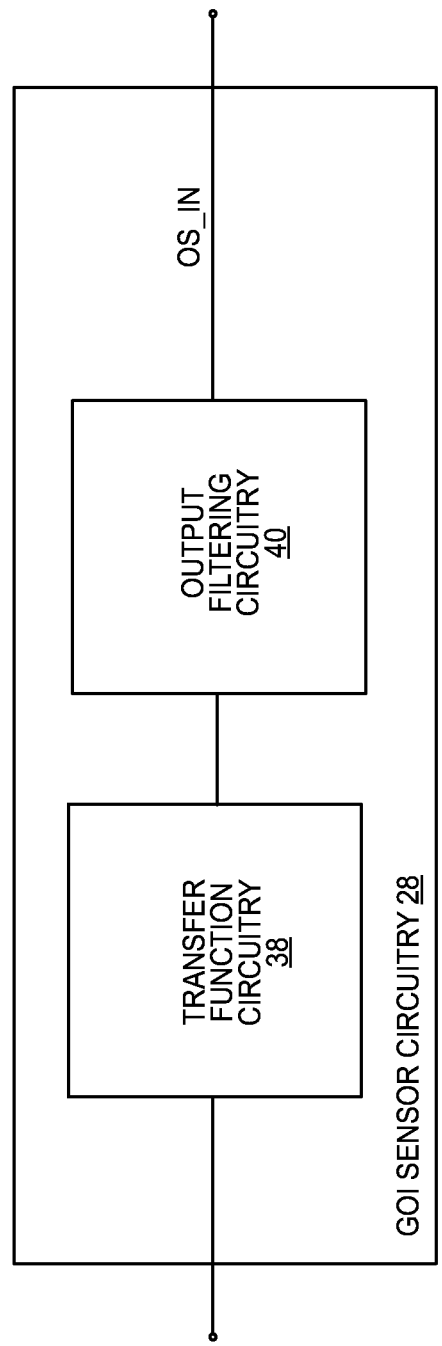
FIG. 10 is a block diagram showing details of the overstress sensor circuitry shown in FIG. 7 according to one embodiment of the present disclosure.

FIG. 10 shows details of the GOI sensor circuitry 28 according to one embodiment of the present disclosure. As shown in FIG. 10, the GOI sensor circuitry 28 includes transfer function circuitry 38 and output filtering circuitry 40. The transfer function circuitry 38 receives a signal at an input of the GOI sensor circuitry 28 and performs a transfer function on the signal, which is subsequently filtered by the output filtering circuitry 40 and passed to an output of the GOI sensor circuitry 28. In one embodiment, the transfer function circuitry 38 is root mean square (RMS) transfer function circuitry such that the output of the transfer function circuitry 38 is the RMS voltage at the input. However, the transfer function circuitry 38 may perform any transfer function without departing from the principles of the present disclosure. Well-known principles in the art may be used to design the transfer function circuitry 38 such that any desired transfer function is performed. In general, the GOI sensor circuitry 28 receives an input signal and performs a transfer function and filtering on the input signal to generate the overstress indicator signal. In one embodiment, the input signal is a gate-to-drain voltage of the amplifier element 14 as discussed above.

Figure 11:
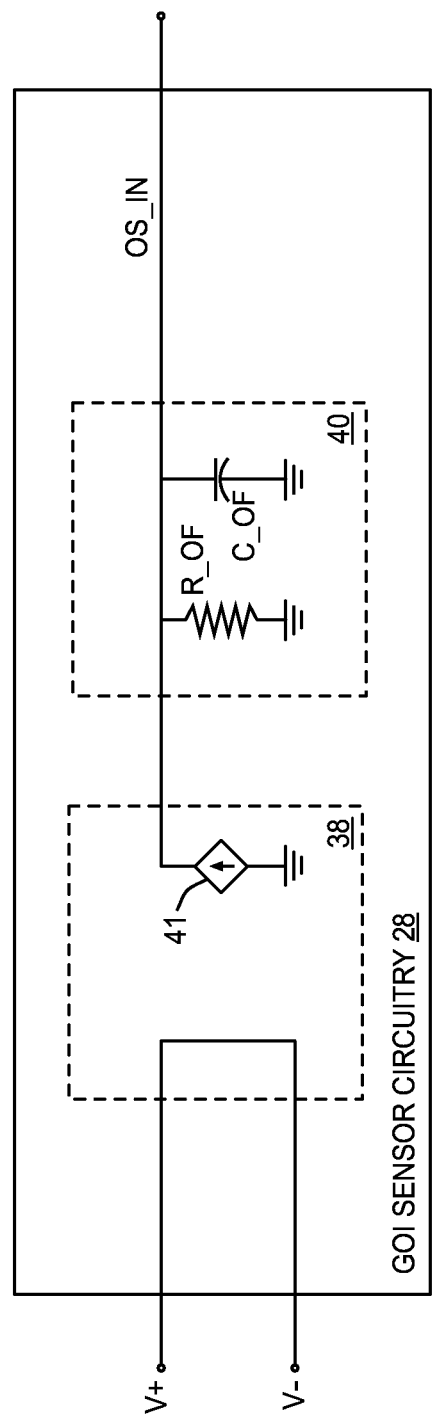
FIG. 11 is a schematic showing details of the overstress sensor circuitry shown in FIG. 10 according to one embodiment of the present disclosure.

FIG. 11 shows further details of the GOI sensor circuitry 28 according to one embodiment of the present disclosure. As shown in FIG. 11, the transfer function circuitry 38 includes voltage controlled dependent current source 41, which may be implemented in any number of ways well known in the art. As discussed above the dependent current source 41 may provide a current that is linearly related to the input signal or non-linearly related to the input signal. While the dependent current source 41 is shown for purposes of illustration, the transfer function circuitry 38 may be implemented in any number of ways that are well known in the art. The output filtering circuitry 40 includes an output filter resistor R_OF and an output filter capacitor C_OF. Accordingly, the output filtering circuitry 40 forms an RC filter circuit, the characteristics of which may be designed according to principles that are well known in the art.

Figure 12:
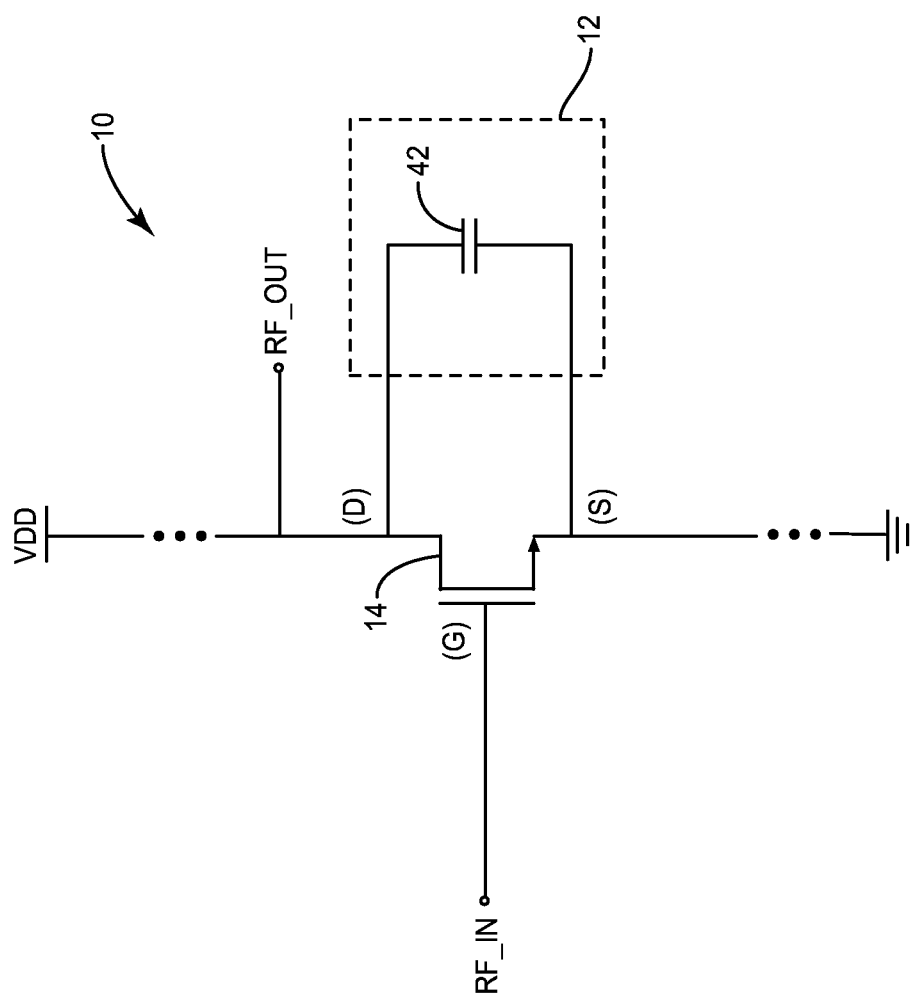
FIG. 12 is a schematic showing details of the RF PA including overstress management circuitry shown in FIG. 12 according to one embodiment of the present disclosure.

FIG. 12 shows the RF PA circuitry 10 according to an additional embodiment of the present disclosure. The RF PA circuitry 10 shown in FIG. 12 includes a simplified version of the overstress management circuitry 12 in which the overstress management circuitry 12 includes an overstress management capacitor 42 coupled across two nodes of the amplifier element 14. The overstress management capacitor 42 serves the function of both the overstress sensor circuitry 18 and the overstress control circuitry 20 discussed above. In the embodiment shown in FIG. 12 in which the amplifier element 14 is a MOSFET, the overstress management capacitor 42 is coupled between a drain contact (D) and a source contact (S) of the amplifier element 14. The particular value of the overstress management capacitor 42 is chosen such that the drain-to-source voltage of the amplifier element 14 is clamped at a value that prevents overstress of the amplifier element 14, while otherwise not interfering with the operation of the amplifier element 14. Accordingly, by preventing high current and high voltage operation of the amplifier element 14, the longevity of the amplifier element 14 may be improved without unduly interfering with the operation thereof.

Figure 13:
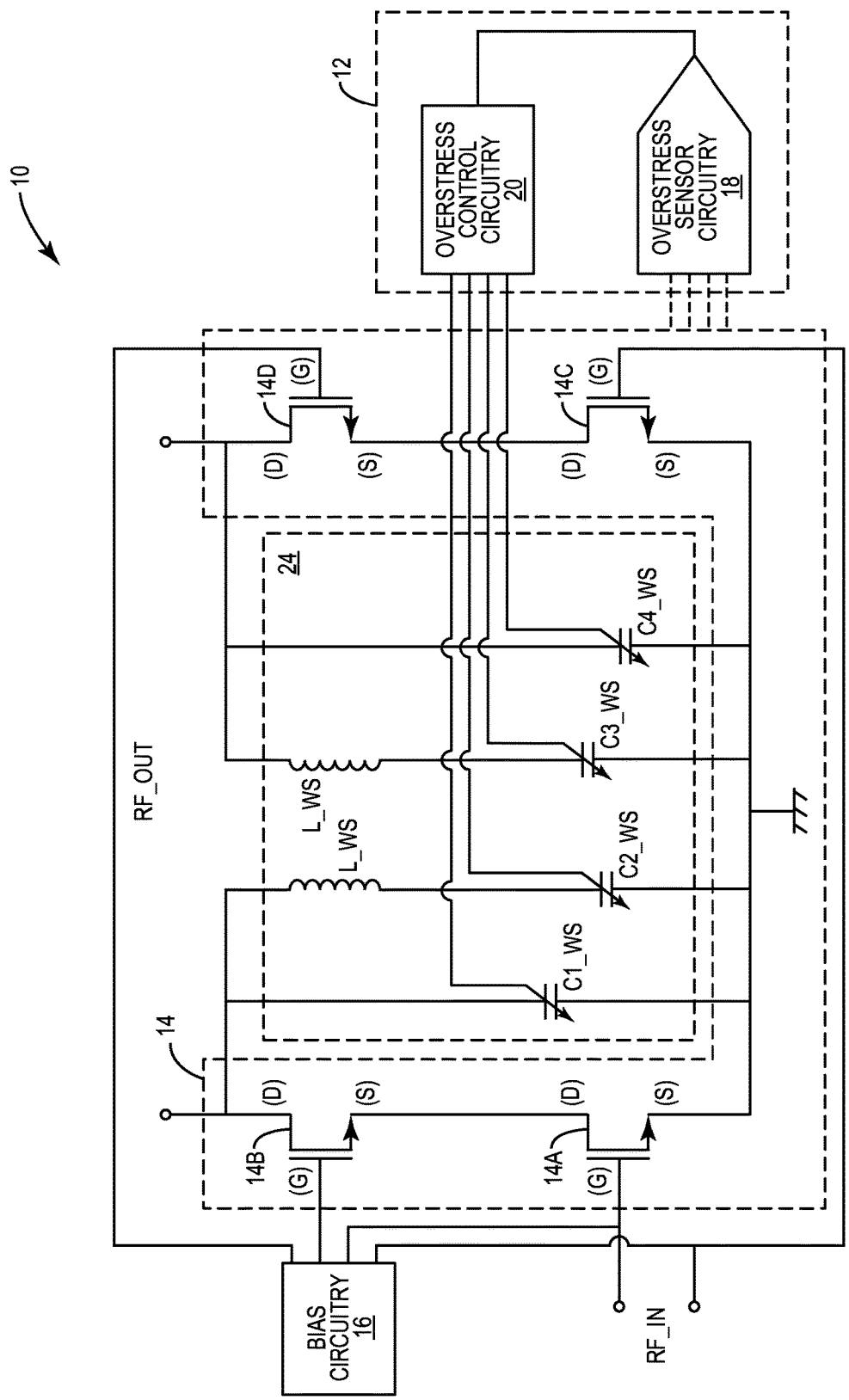
FIG. 13 is a schematic showing details of the RF PA according to an additional embodiment of the present disclosure.

FIG. 13 shows details of the RF PA circuitry 10 according to an additional embodiment of the present disclosure. The circuitry shown in FIG. 13 is similar to that shown in FIG. 5, except that the amplifier element 14 is a differential amplifier 14 including a first amplifier element 14A, a second amplifier element 14B, a third amplifier element 14C, and a fourth amplifier element 14D. In one embodiment in which the amplifier elements 14 are MOSFETs, a gate contact (G) of the first amplifier element 14A is configured to receive a first differential portion of the RF input signal RF_IN and a bias signal BIAS, and a source contact (S) of the first amplifier element 14A is coupled to ground. A gate contact (G) of the second amplifier element 14B is configured to receive a bias signal BIAS, a source contact (S) of the second amplifier element 14B is coupled to a drain contact (D) of the first amplifier element 14A, and a drain contact (D) of the second amplifier element 14B is configured to output a first differential portion of the RF output signal RF_OUT. Further, the drain contact (D) of the second amplifier element 14B is coupled to the output waveform shaping circuitry 24.

A gate contact (G) of the third amplifier element 14C is configured to receive a second differential portion of the RF input signal RF_IN and a bias signal BIAS, and a source contact (S) of the third amplifier element 14C is coupled to ground. A gate contact (G) of the fourth amplifier element 14D is configured to receive a bias signal BIAS, a source contact (S) of the fourth amplifier element 14D is coupled to a drain contact (D) of the third amplifier element 14C, and a drain contact (D) of the fourth amplifier element 14D is configured to output a second differential portion of the RF output signal RF_OUT.

The output waveform shaping circuitry 24 may be similar to that shown in FIG. 6, but includes mirrored elements for each one of the second amplifier element 14B and the fourth amplifier element 14D. Specifically, the output waveform shaping circuitry 24 includes a first waveform shaping capacitor C1_WS coupled between the drain contact (D) of the second amplifier element 14B and ground and a waveform shaping inductor L_WS coupled in series with a second waveform shaping capacitor C2_WS between the drain contact (D) of the second amplifier element 14B and ground. The output waveform shaping circuitry 24 also includes a third waveform shaping capacitor C3_WS coupled between the drain contact (D) of the fourth amplifier element 14D and ground and a waveform shaping inductor L_WS coupled in series with a fourth waveform shaping capacitor C4_WS between the drain contact (D) of the fourth amplifier element 14D and ground. Further, the output waveform shaping circuitry 24 may function in a substantially similar manner as that shown in FIG. 6. The overstress sensor circuitry 18 may be coupled to any one of the amplifier elements 14 and in any fashion, as discussed above. The overstress control circuitry 20 may be coupled to the output waveform shaping circuitry 24 and adjust one or more of the variable impedance elements therein as discussed above.

Those skilled in the art will recognize improvements and modifications to the embodiments of the present disclosure. All such improvements and modifications are considered within the scope of the concepts disclosed herein and the claims that follow.

What is claimed is:
1. A power amplifier comprising:
   an amplifier element configured to receive and amplify a radio frequency (RF) input signal to provide an RF output signal; and
   overstress management circuitry comprising:
      overstress sensor circuitry comprising a hot carrier injection (HCI) overstress sensor coupled to the amplifier element, the overstress sensor circuitry configured to:
         detect an overstress condition of the amplifier element; and
         produce an overstress indicator signal; and
      overstress control circuitry coupled to the overstress sensor circuitry and configured to adjust one or more operating parameters of the amplifier element in response to the overstress indicator signal.

2. The power amplifier of claim 1 wherein the amplifier element is a transistor including a gate contact, a drain contact, a source contact, and a bulk contact.

3. The power amplifier of claim 2 wherein the overstress management circuitry comprises a capacitor coupled between the source contact and the drain contact of the transistor and configured to reduce a voltage between the gate contact and the source contact when a voltage above a predetermined threshold is present between the drain contact and the source contact.

4. The power amplifier of claim 1 wherein the overstress sensor circuitry comprises:
input filtering circuitry;
transfer function circuitry coupled to an output of the input filtering circuitry; and
output filtering circuitry coupled to an output of the transfer function circuitry.

5. The power amplifier of claim 4 wherein:
the input filtering circuitry is configured to receive an overstress measurement signal from the amplifier element and filter out high frequency components of the overstress measurement signal to produce a filtered overstress measurement signal;
the transfer function circuitry is configured to perform a non-linear signal transformation on the filtered overstress measurement signal to generate a transformed overstress measurement signal; and
the output filtering circuitry is configured to filter the transformed overstress measurement signal to generate the overstress indicator signal.

6. The power amplifier of claim 4 wherein the overstress sensor circuitry further comprises integrator circuitry coupled between the transfer function circuitry and the output filtering circuitry.

7. The power amplifier of claim 6 wherein:
the input filtering circuitry is configured to receive an overstress measurement signal from the amplifier element and filter out high frequency components of the overstress measurement signal to produce a filtered overstress measurement signal;
the transfer function circuitry is configured to perform a non-linear signal transformation on the filtered overstress measurement signal to generate a transformed overstress measurement signal;
the integrator circuitry is configured to receive and integrate the transformed overstress measurement signal to generate a transformed and integrated overstress measurement signal; and
the output filtering circuitry is configured to filter the transformed and integrated overstress measurement signal to generate the overstress indicator signal.

8. The power amplifier of claim 1 wherein the overstress control circuitry is configured to adjust a biasing voltage provided to the amplifier element in response to the overstress indicator signal.

9. The power amplifier of claim 1 wherein the overstress control circuitry is configured to adjust one of the RF input signal and the RF output signal in response to the overstress indicator signal.

10. The power amplifier of claim 1 wherein:
the RF input signal is provided to an input of the amplifier element and the RF output signal is provided at an output of the amplifier element; and
the overstress control circuitry is configured to adjust an impedance presented to the output of the amplifier element in response to the overstress indicator signal.

11. The power amplifier of claim 10 further comprising output waveform shaping circuitry configured to receive a control signal from the overstress control circuitry and adjust an LC harmonic trap circuit in response to the control signal.

12. The power amplifier of claim 2 wherein the overstress sensor circuitry is configured to measure a bulk current of the amplifier element.

13. The power amplifier of claim 1 wherein the overstress sensor circuitry further comprises a gate oxide integrity (GOI) overstress sensor.

14. The power amplifier of claim 13 wherein the overstress sensor circuitry is configured to measure a bulk current of the amplifier element and a voltage between one or more contacts of the amplifier element.

15. The power amplifier of claim 13 wherein the overstress sensor circuitry is configured to measure a root mean square (RMS) voltage between one or more contacts of the amplifier element.

16. The power amplifier of claim 13 wherein the overstress control circuitry is configured to adjust a biasing voltage provided to the amplifier element in response to the overstress indicator signal.

17. The power amplifier of claim 13 wherein the overstress control circuitry is configured to adjust an input signal provided to the amplifier element in response to the overstress indicator signal.

18. The power amplifier of claim 13 wherein the overstress control circuitry is configured to adjust an impedance at an output of the amplifier element in response to the overstress indicator signal.

19. A power amplifier comprising:
a plurality of amplifier elements configured to receive a radio frequency (RF) input signal at an input, amplify the RF input signal, and provide an RF output signal at an output; and
overstress management circuitry comprising:
overstress sensor circuitry comprising a hot carrier injection (HCI) overstress sensor coupled to the amplifier element, the overstress sensor circuitry configured to:
detect an overstress condition of the amplifier element; and
produce an overstress indicator signal; and
overstress control circuitry coupled to the overstress sensor circuitry and configured to:
adjust one or more operating parameters of the plurality of amplifier elements in response to the overstress indicator signal; and
adjust an impedance presented to the output of the plurality of amplifier elements in response to the overstress indicator signal.

20. The power amplifier of claim 19 wherein the overstress sensor circuitry further comprises a gate oxide integrity (GOI) overstress sensor.

* * * * *

UNITED STATES PATENT AND TRADEMARK OFFICE
CERTIFICATE OF CORRECTION

PATENT NO. : 9,787,270 B2
APPLICATION NO. : 14/554681
DATED : October 10, 2017
INVENTOR(S) : Baker Scott, George Maxim and Dirk Robert Walter Leipold It is certified that error appears in the above-identified patent and that said Letters Patent is hereby corrected as shown below:

In the Specification

In Column 9, Line 48, replace "sensor circuitry 26 and 001 sensor circuitry" with --sensor circuitry 26 and GOI sensor circuitry--.

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*